(12) United States Patent
Tsuji

(10) Patent No.: US 6,885,432 B2
(45) Date of Patent: Apr. 26, 2005

(54) PROJECTION EXPOSURE APPARATUS AND DEVICE MANUFACTURING METHOD

(75) Inventor: Toshihiko Tsuji, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/411,834

(22) Filed: Apr. 11, 2003

(65) Prior Publication Data

US 2004/0001190 A1 Jan. 1, 2004

(30) Foreign Application Priority Data

Apr. 15, 2002 (JP) .......................... 2002-112055

(51) Int. Cl.$^7$ .................. G03B 27/54; G03B 27/42; G21K 5/00
(52) U.S. Cl. .................. 355/67; 355/53; 378/34
(58) Field of Search .................. 355/67, 53, 55, 355/57, 60, 45; 378/34, 35; 359/850; 430/5

(56) References Cited

U.S. PATENT DOCUMENTS

| 5,339,346 A | 8/1994 | White |
| 5,430,781 A | 7/1995 | Miyake et al. |
| 5,524,039 A | 6/1996 | Kamon |
| 6,109,756 A | 8/2000 | Takahashi |
| 6,172,825 B1 | 1/2001 | Takahashi |
| 6,213,610 B1 | 4/2001 | Takahashi et al. |

FOREIGN PATENT DOCUMENTS

| EP | 1 039 510 A1 | 9/2000 |
| JP | 7-220997 | 8/1995 |
| JP | 10-70058 | 3/1998 |
| JP | 11-312638 | 11/1999 |
| JP | 2001-100694 | 4/2000 |
| JP | 2000-244168 | 9/2001 |

*Primary Examiner*—Peter B. Kim
(74) *Attorney, Agent, or Firm*—Morgan & Finnegan, LLP

(57) ABSTRACT

Disclosed is an exposure apparatus for illuminating a reflection type mask with light from a light source and for exposing a substrate with a pattern of the illuminated reflection type mask, wherein the apparatus includes a projection optical system for projecting the pattern of the reflection type mask onto the substrate, the projection optical system having a stop, wherein the stop has a first opening for defining a numerical aperture of the projection optical system, and a second opening through which light from the reflection type mask passes. This structure effective avoids unwanted physical interference among optical components of an illumination system or the projection optical system even when the size of the whole exposure apparatus is made compact to some degree.

9 Claims, 13 Drawing Sheets

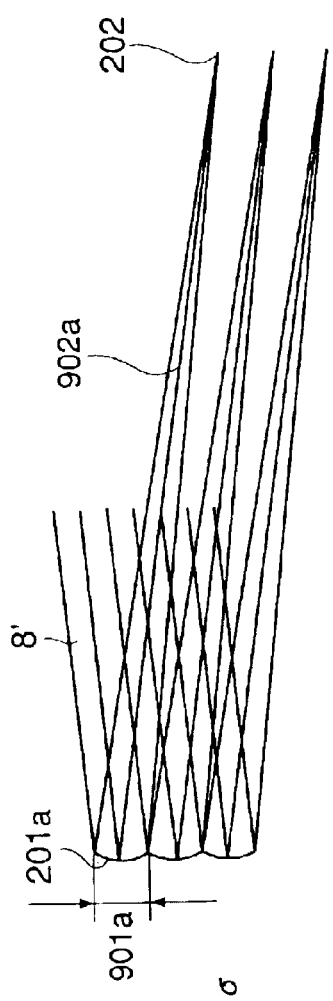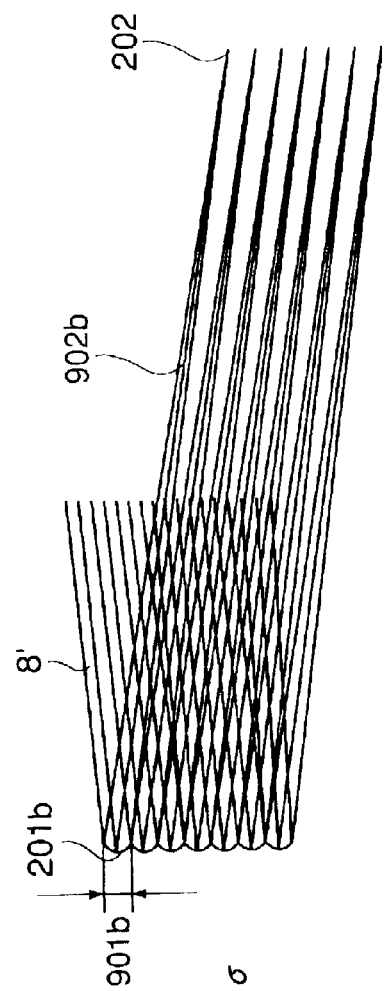

PROJECTION EXPOSURE APPARATUS AND DEVICE MANUFACTURING METHOD

FIELD OF THE INVENTION AND RELATED ART

This invention relates generally to an exposure apparatus and, more particularly, to an exposure apparatus for transferring a fine pattern of an electronic circuit device, for example, formed on a reflection type mask, by use of light in a wavelength region of 200–10 nm as exposure light. Also, the invention concerns a device manufacturing method that uses such an exposure apparatus.

As a method of manufacturing a semiconductor circuit device having a fine pattern, for example, there is a reduction projection exposure method that uses EUV light of a wavelength 13–14 nm, for example. In this method, a mask (reticle) having a circuit pattern formed thereon is illuminated with EUV light, and an image of the pattern of the mask is projected onto the surface of a wafer in a reduced scale to expose a resist on the wafer surface, whereby the pattern is transferred thereto.

Conventional EUV reduction projection exposure apparatuses have a structure such as shown in FIG. 14, for example. More specifically, FIG. 14 is a schematic view of a main portion of a conventional EUV reduction projection exposure apparatus. FIG. 15 is a schematic and perspective view of a conventional reflection type integrator. FIG. 16 is a view illustrating an illumination region on the surface of a conventional a mask.

In these drawings, denoted at 1001 is a light emission point for EUV light, and denoted at 1002 is an EUV light beam therefrom. Denoted at 1003 is a filter, and denoted at 1004 is a first rotation paraboloid mirror. Denoted at 1005 is a reflection type integrator, and denoted at 1006 is a second rotation paraboloid mirror. Denoted at 1007 is a reflection type mask. Denoted at 1008 are mirror systems, constituting a projection optical system. Denoted at 1009 is a wafer. Denoted at 1010 is a mask stage, and denoted at 1011 is a wafer stage. Denoted at 1012 is an aperture having an arcuate opening. Denoted at 1013 is a laser light source, and denoted at 1014 is a laser condensing optical system. Denoted at 1015 is an illumination region defined on the mask surface, and denoted at 1016 is an arcuate region in which pattern exposure is to be carried out. Denoted at 1017 is a vacuum casing.

A conventional EUV reduction projection exposure apparatus comprises an EUV light source, an illumination optical system, a mask 1007, a projection optical system 1008, a wafer 1009, mask and wafer stages 1010 and 1011 for carrying a mask and a wafer thereon, an alignment mechanism (not shown) for precision alignment of the mask and wafer, a vacuum casing for maintaining a vacuum ambience for the optical system as a whole to prevent attenuation of the EUV light, an exhausting system (not shown), and so on.

As examples of EUV light source, laser plasma and undulator are used. In the illumination optical system, the EUV light 1002 from the light emission point 1001 is collected by the first paraboloid mirror 1004, and the light is then projected to the reflection type integrator 1005 by which a plurality of secondary light sources are produced. EUV light beams from these secondary light sources are collected by the second paraboloid mirror 1006 so that these light beams are superposed one upon another on the mask 1007 surface, by which the mask 1007 is uniformly illuminated.

The reflection type mask 1007 comprises, for example, a multilayered-film reflection mirror having formed thereon a transfer pattern with a non-reflective portion made of an EUV absorptive material. The EUV light reflected by the reflection type mask 1008 and thus having information about the circuit pattern on the mask is imaged upon the wafer 1009 surface by the projection optical system 1008. The projection optical system 1008 is designed to provide superior imaging performance with respect to a narrow arcuate region off the optical axis center. In order that the exposure is carried out by using this narrow arcuate region only, an aperture 1012 having a arcuate opening is provided just before the wafer 1009. Then, for transfer of the pattern on the whole mask having a rectangular shape, the exposure is carried out while the mask 1007 and the wafer 1009 are synchronously scanningly moved. The projection optical system 1008 comprises a plurality of multilayered-film mirrors, and it is arranged to project the pattern of the mask 1007 onto the wafer 1009 surface in a reduced scale. Usually, a telecentric system being telecentric on the image side is used. As regards the object side (reflection mask side), usually it has a non-telecentric structure so as to avoid physical interference with the illumination light impinging on the reflection type mask 1007.

In FIG. 14, the illumination optical system comprises first paraboloid mirror 1004, reflection type integrator 1005, and second paraboloid mirror 1006. The reflection type integrator 1005 comprises a fly's eye lens, as shown in FIG. 15, having a number of small convex or concave surfaces arrayed two-dimensionally.

The laser light from the laser light source 1013 is collected by the laser condensing optical system 1014, at a target (not shown) placed at the light emission point 1001 position, thereby to produce a high temperature plasma light source 1001 there. The EUV light 1002 being emitted from this plasma light source by thermal radiation is reflected by the first paraboloid mirror 1004, whereby a parallel EUV light beam is produced. This light beam is then reflected by the reflection type integrator 1005, whereby a large number of secondary light sources are produced.

EUV light from these secondary light sources are reflected by the second paraboloid mirror 1006, to illuminate the reflection type mask 1007. Here, the distance from the secondary light sources to the second paraboloid mirror 1006, and the distance from the second paraboloid mirror 1006 to the reflection type mask 1007 are set approximately equal to the focal length of the second paraboloid mirror 1006. Namely, the focal point of the second paraboloid mirror 1006 is disposed at the position of the secondary light sources. As a result, the EUV light emitted from one secondary light source illuminates the mask 1007, as a parallel light beam. The projection optical system 1008 is designed so that the image of the secondary light source is projected on an entrance pupil plane of the projection optical system 1008. Thus, the condition for Koehler illumination is satisfied. Namely, the EUV light impinging on a certain point on the reflection type mask 1007 is provided by superposition of EUV light beams emitted from all of the secondary light sources.

The shape of the illumination region 1015 defined on the mask surface is, as shown in FIG. 16, analogous to the shape of the convex or concave surface mirrors which are constituent components of the reflection type integrator 1005. Since it is an approximately rectangular shape region including an arcuate region 1016 where the exposure is to be actually carried out, many EUV light beams impinge on a portion other than the exposure region 1016. These EUV light beams not contributable to the exposure are intercepted by the aperture 1012 that defines the exposure region.

Conventional EUV reduction projection exposure apparatuses use a reflection type mask as described above, and the illumination optical system as well as a projection optical system are disposed on the same side with respect to the reflection type mask. Therefore, in order to make the size of the whole exposure apparatus compact to some degree, it may cause unwanted physical interference among various optical components constituting the illumination system or the projection optical system, for example.

Furthermore, if an arcuate aperture is disposed just before a wafer, it may cause physical interference with the wafer. The aperture therefore has to be placed away from the wafer, but this raises a problem that the exposure region cannot be defined very precisely.

SUMMARY OF THE INVENTION

In consideration of the problems peculiar to EUV reduction projection exposure apparatuses such as described above, it is an exemplary object of the present invention to provide an exposure apparatus by which, where a reflection type mask is used and even when the size of the whole exposure apparatus is made compact, there does not occur physical interference among optical components constituting the exposure apparatus. Also, it is an object of the present invention to provide a device manufacturing method which uses such an exposure apparatus.

In accordance with an aspect of the present invention, there is provided an exposure apparatus for illuminating a reflection type mask with light from a light source and for exposing a substrate with a pattern of the illuminated reflection type mask, said apparatus comprising: a projection optical system for projecting the pattern of the reflection type mask onto the substrate, said projection optical system having a stop; wherein said stop has a first opening for defining a numerical aperture of said projection optical system, and a second opening through which light from the reflection type mask passes.

In accordance with another aspect of the present invention, there is provided an exposure apparatus for illuminating a reflection type mask with light from a light source and for exposing a substrate with a pattern of the illuminated reflection type mask, said apparatus comprising: a projection optical system for forming an intermediate image of the pattern of the reflection type mask and for re-imaging the intermediate image upon the substrate; wherein said projection optical system has a field stop at or adjacent the position where the intermediated image is formed.

In accordance with a further aspect of the present invention, there is provided an exposure apparatus for illuminating a reflection type mask with light from a light source and for exposing a substrate with a pattern of the illuminated reflection type mask, said apparatus comprising: a projection optical system for projecting the pattern of the reflection type mask onto the substrate, said projection optical system having a plurality of optical elements; wherein the light illuminating the reflection type mask passes between first and second optical elements of said plurality of optical elements.

In accordance with a yet further aspect of the present invention, there is provided a device manufacturing method, comprising the steps of: exposing a substrate with a pattern by use of an exposure apparatus as recited above; and developing the exposed substrate.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 9A and 9B illustrate adjustment of a (sigma) by switching the first integrator.

DESCRIPTION OF THE PREFERRED EMBODIMENTS

Preferred embodiments of the present invention will now be described with reference to the attached drawings.

Figure 1:
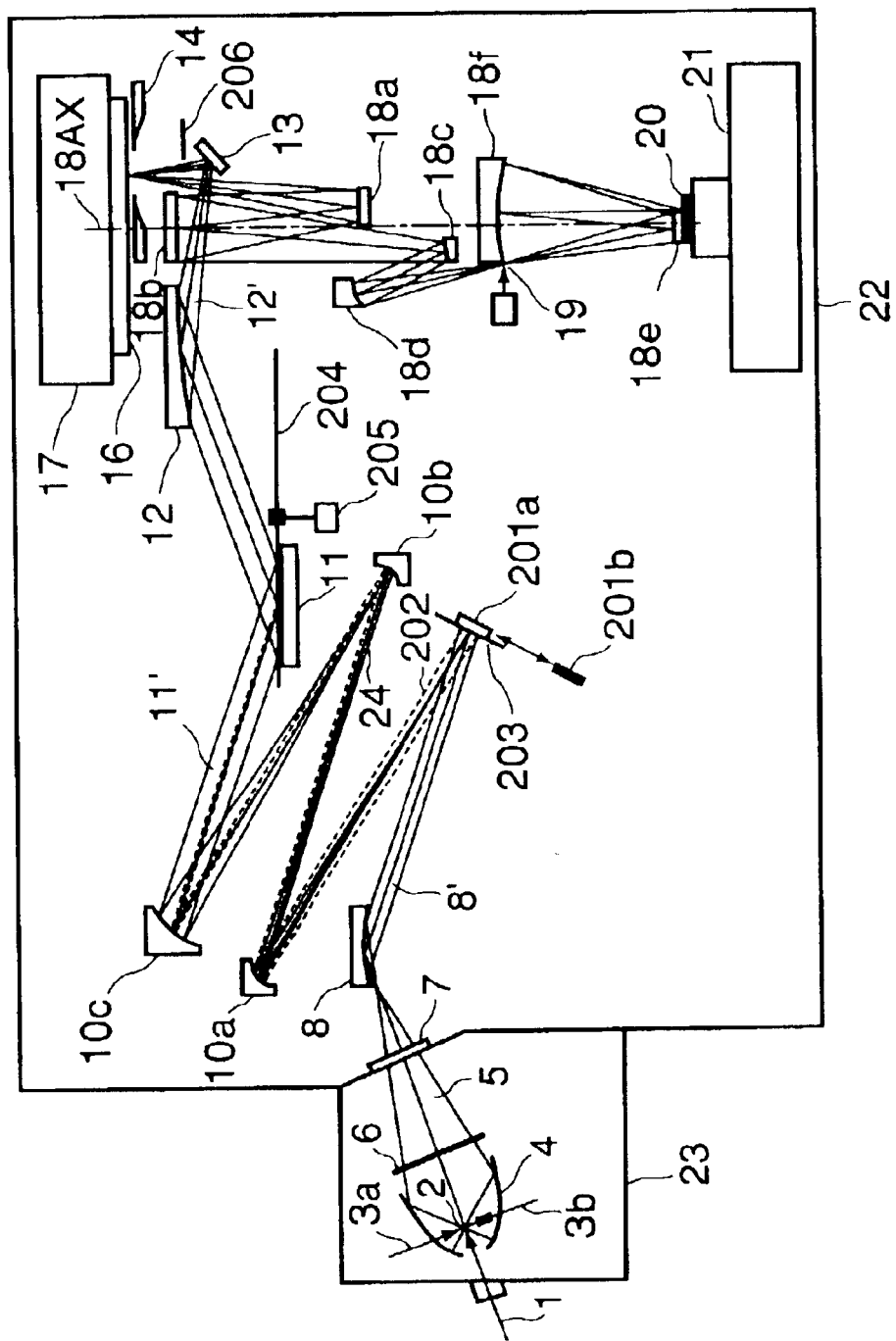
FIG. 1 is a schematic view of an exposure apparatus according to an embodiment of the present invention.

FIG. 1 is a schematic view of a main portion of an exposure apparatus according to an embodiment of the present invention. Denoted in the drawing at 1 is laser light, and denoted at 2 is a plasma light emission point for emitting EUV light. Denoted at 3a is a nozzle for discharging liquid drops as target in the plasma production. Denoted at 3b is a liquid drop collecting portion for collecting liquid drops, not irradiated with excited laser light, for reuse of the same. Denoted at 4 is a condensing mirror, and denoted at 5 is EUV light collected by the mirror 4. Denoted at 6 is a filter, and denoted at 7 is a window for passing EUV light while maintaining a vacuum. Denoted at 8, 10a, 10b, and 10c are mirrors having a rotation paraboloid surface, for example.

Denoted at 201a and 201b are first integrators which comprise a plurality of concave mirrors and used interchangeably. Denoted at 11 is a second integrator having a plurality of cylindrical surface mirrors, and denoted at 12 is a condensing mirror for converging light from the second integrator. Denoted at 13 is a plane mirror for deflecting the light, and denoted at 14 is a masking blade. Denoted at 16 is a reflection type mask, and denoted at 17 is a mask stage. Denoted at 18a–18f are components constituting a projection optical system, and denoted at 19 is a variable slit having an arcuate and variable opening. Denoted at 20 is a wafer having a photosensitive material applied thereto, and denoted at 21 is a wafer stage. Denoted at 22 and 23 are vacuum casings for maintaining the whole optical system in a vacuum to prevent attenuation of the EUV light.

A high-power excited laser pulse light 1 emitted from an excited laser light source (not shown) and a condensing optical system (also not shown) is converged at the position of the light emission point 2, and thus it provides a laser plasma light source. Liquid drops (Xe, for example) as the target of the laser plasma light source are successively discharged from the nozzle 3a at regular time intervals, and they pass the convergence point 2. As a liquid drop being discharged so just comes the position 2, the excited pulse laser light 1 irradiates that liquid drop, whereby a high-temperature plasma light emission point 2 is produced. EUV light is produced from this plasma, by thermal radiation.

While Xe liquid drops are used as the target in this embodiment, as a matter of course, Xe gas as a target may be blown from a nozzle into a vacuum so that clusters produced by adiabatic expansion may be used, or Xe gas may be cooled by a metal surface and solidified Xe may be used. Also, a target produced by using a metal such as Cu or Sn may be used. Alternatively, an undulator may be used as an EUV light source, within the scope of the present invention.

The EUV light emitted from the plasma light emission point 2 is collected by the rotation elliptical mirror 4, whereby an EUV light beam 5 is provided. It passes through the filter 6 for intercepting scattered particles from the plasma or from a peripheral portion thereof and for blocking unwanted wavelengths being unnecessary for exposure. The EUV light then passes through the window 7 which is provided at the boundary between the vacuum casings 21 and 22. Then, the light is reflected by the paraboloid mirror 8, whereby an approximately parallel light beam 8' is produced. The elliptical mirror 4 described above has a multilayered reflective film formed thereon, for efficient reflection of EUV light. Since it absorbs a portion of radiation energies from the high-temperature plasma 2, the temperature thereof rises during the exposure process. In consideration of it, a material having high heat conductivity is used therefor. Also, cooling means (not shown) is used to cool the same continuously.

Although not mentioned to specifically in the following, the reflection surfaces of various mirrors used in the optical system similarly have a multilayered reflective film for efficient reflection of EUV light. These mirrors may be made of a material having good heat conductivity may be used, and also cooling means may be used similarly.

The EUV light 8', now parallel light beam, enters the first integrator 201a having a surface in which a plurality of small concave surface mirrors are arrayed two-dimensionally. With these concave surface mirrors, a large number light spots are produced, by which a point light source array 202 is defined in the space. EUV light beams emitted from this point light source array 202 are collected by the paraboloid mirror 10a such that they are superposed one upon another at the rear focal point position thereof. As a result, a two-dimensional light source image 24 having a substantially uniform intensity distribution is produced.

Here, the first integrator 201a will be explained in greater detail, with reference to FIGS. 2A and 2B. FIG. 2A is a schematic view of the first integrator, as viewed from the reflection surface. Denoted at 210 is one of small concave surface mirrors. The surface shape of the concave mirror is approximately spherical. Thus, a large number of mirrors having the same shape are arrayed two dimensionally, like a fly's eye. In FIG. 2A, the concave surface mirrors 210 each having a hexagonal outside shape are arrayed into a honeycomb structure. However, mirrors of quadrangle outside shape may be arrayed in a grid-like structure. A large number of mirror surfaces so combined into an integral structure are provided with a reflective multilayered film, to assure reflection of EUV light at a high efficiency.

Figure 2B:
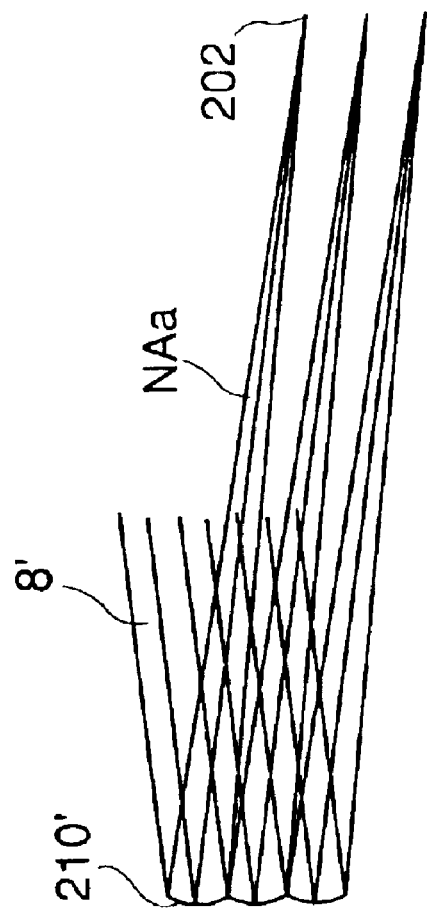
FIG. 2B is a side view, illustrating a state in which light beams are incident on a portion of the first integrator.
Figure 2A:
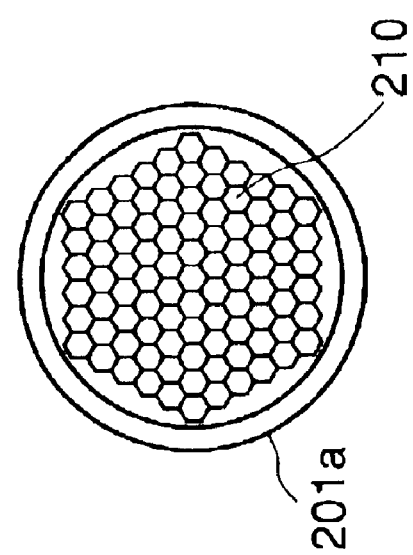
FIG. 2A is a schematic view of a first integrator as viewed from a reflection surface.

FIG. 2B is a side view, illustrating the state in which light is incident on arbitrary three consecutive mirror surfaces, chosen from the large number of mirror surfaces 210 of the first integrator. Namely, the concave surface mirror 210, is illustrated as a sectional view. As shown in the drawing, when the EUV light is incident on the concave surface mirror 210', the light is converged at a focal point 202 thereof. This is also the case with the neighboring mirror. Since the first integrator comprises such mirrors being arrayed such as shown in FIG. 2A, the EUV light 8' impinging on these reflection surfaces produces a large number of light spots, at the focal point position 202, corresponding to the array of the mirror surfaces. Thus, a point light source array 202 is provided.

The EUV light from the secondary light sources 24 produced as described above is transformed by the paraboloid mirrors 10b and 10c into EUV light 11' having a desired size and having an approximately uniform intensity within the beam diameter. This light then enters a second reflection type convex cylindrical surface integrator 11.

The function of the first integrator described above may be provided by use of plural integrators.

Next, the principle of uniform illumination of an arcuate region on a surface to be illuminated, by use of the second integrator 11, will be explained in greater detail, with reference to FIGS. 3–6.

Figure 3A:
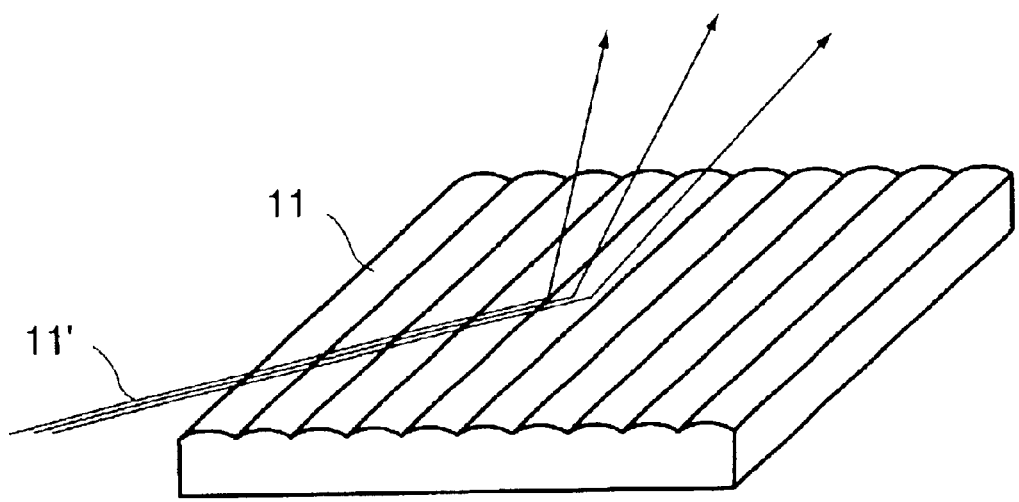
FIG. 3A is a schematic and perspective view, illustrating a state in which parallel light is incident on a second integrator having a plurality of convex cylindrical surfaces.
Figure 3B:
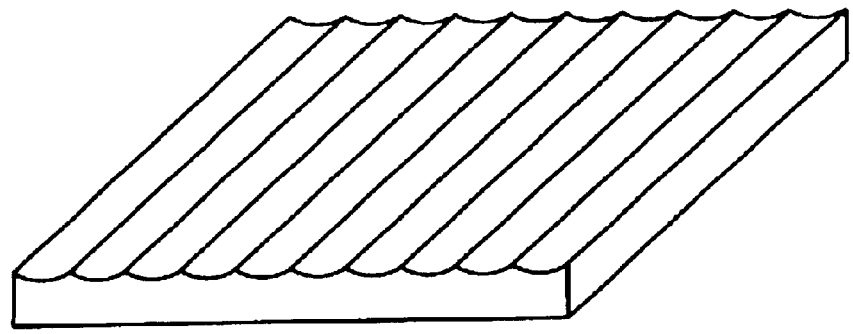
FIG. 3B is a schematic and perspective view, illustrating a state in which parallel light is incident on a second integrator having a plurality of concave cylindrical surfaces.

FIG. 3A is a schematic and perspective view, illustrating a case wherein parallel light is incident on a reflection type convex cylindrical surface integrator, having a plurality of convex cylindrical surfaces. EUV light 11' is projected in the direction illustrated. FIG. 3B is a schematic and perspective view of a reflection type concave cylindrical surface integrator, with a plurality of concave cylindrical surfaces having a similar function as of that of FIG. 3A. The integrator 11 shown in FIG. 1 is a reflection type convex cylindrical surface integrator such as shown in FIG. 3A. However, a reflection type concave cylindrical surface integrator such as shown in FIG. 3B or, alternatively, a combination of concave and convex cylindrical surfaces may be used in place of it.

Figure 4:
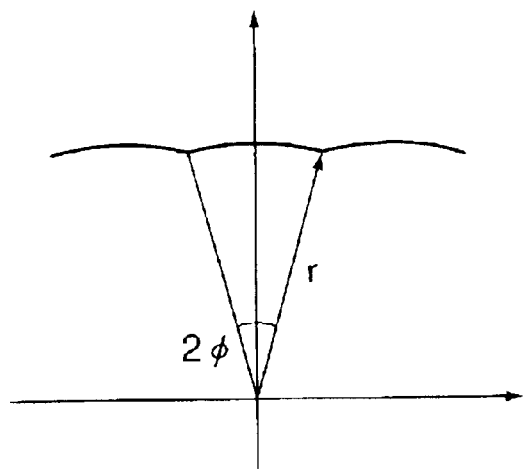
FIG. 4 is a schematic view for explaining reflection of light at a cylindrical surface.
Figure 5:
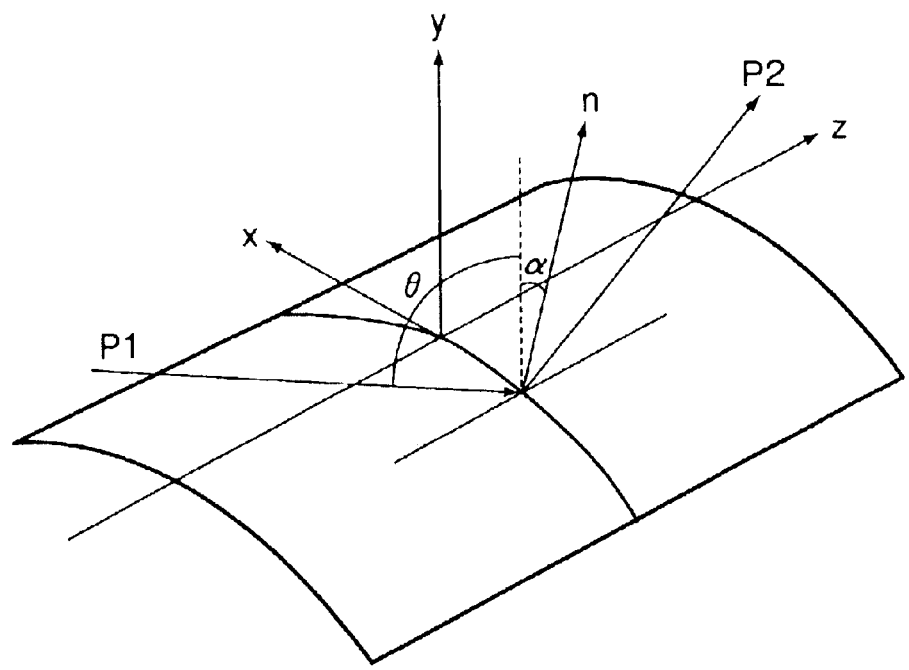
FIG. 5 is a schematic view for explaining an angular distribution of light reflected by a cylindrical surface.
Figure 6:
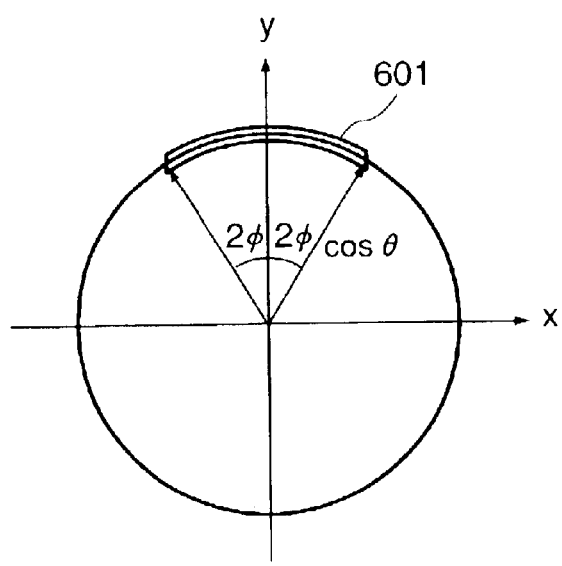
FIG. 6 is schematic view for explaining an arcuate region to be defined by light reflected by a cylindrical surface.

FIG. 4 is a schematic and sectional view of a reflection type convex cylindrical surface integrator, and FIG. 5 is a view for explaining EUV light reflection at the cylindrical surface of a reflection type convex cylindrical surface integrator. FIG. 6 illustrates an angular distribution of EUV light as reflected by the cylindrical surface of a reflection type convex cylindrical surface integrator.

Reference numeral 11 in these drawings denotes a reflection type convex cylindrical surface integrator. When an approximately parallel EUV light beam is projected upon an integrator 11 having a plurality of cylindrical surfaces, such as shown in FIG. 3A, secondary light sources are produced by the integrator and, additionally, the angular distribution of the EUV light emitted from these secondary light sources is made into a conical surface shape. Then, by reflecting this EUV light by use of a reflection mirror having a focal point placed at the secondary light source position, and by illuminating the mask or a surface being substantially conjugate with the mask with the EUV light, the mask or the surface can be illuminated with arcuate shape.

In order to explain the operation of a reflection type integrator having a plurality of cylindrical surfaces, first, the action of reflection light as parallel light is incident on one cylindrical surface reflection mirror will be described with reference to FIG. 5. Now, a case where parallel light is incident upon one cylindrical surface, with an angle $\theta$ with respect to a plane perpendicular to the central axis of the cylindrical surface, will be considered.

Where a light ray vector of the parallel light is denoted by $P1=(0, -\cos\theta, \sin\theta)$ while a normal line vector to the reflection surface of cylindrical surface shape is denoted by $n=(-\sin\alpha, \cos\alpha, 0)$, then the light ray vector of the reflection light is expressed by:

$$P2 = P1 - 2(P1 \cdot n)n$$
$$= (-\cos\theta x \sin 2\alpha, \cos\theta x \cos 2\alpha, \sin\theta).$$

By plotting the light ray vector of reflection light in a phase space, as shown in FIG. 6, a circle of radius $\cos\theta$ is obtained on the x-y plane. Namely, the reflection light becomes divergent light along a conical surface shape, and a secondary light source (linear light source) is present at the position of apex of the conical surface. Where the cylindrical surface of the integrator 11 is concave, the secondary light source is present as a real image, outside the reflection surface. Where it is convex, the secondary light source is present, as a virtual image, inside the cylindrical surface. Further, where the reflection surface is defined by a limited portion of a cylindrical surface such as shown in FIG. 4 and the central angle thereof is $2\phi$, the range of existence of the light ray vector P2 of the reflection light is in an arcuate 601 (FIG. 6) having a central angle $4\phi$ upon the x-y plane.

Next, description will be made on a case of a rotation paraboloid surface mirror having a focal length f and having a focal point disposed at the secondary light source position defined by parallel light, projected on a cylindrical surface reflection mirror such as described above, wherein a surface to be illuminated is placed at a position spaced by f from this reflection mirror. Light emitted from the secondary light source is divergent light of a conical surface shape and, after being reflected by the reflection mirror with a focal length f, it is transformed into parallel light. The reflection light here is a sheet-like beam of arcuate sectional shape, having a radius $f x \cos\theta$ and a center angle $4\phi$. Thus, as shown in FIG. 6, only an arcuate region 601 upon the surface to be illuminated, having a radius $fx \cos\theta$ and a center angle $4\phi$, is illuminated.

While the foregoing description has been made with reference to a single cylindrical surface reflection mirror, now a case where, as shown in FIG. 3A, parallel light of a thickness D is incident on a wide-area integrator 11 having a large number of cylindrical surfaces arrayed in parallel to each other, is considered. If the mask is disposed at a position spaced from the reflection mirror by a focal length f, like the foregoing example, the angular distribution of the light reflected by the reflection mirror, having many cylindrical surfaces arrayed in parallel to each other, is unchanged from the foregoing example. Thus, upon the mask, an arcuate region of a radius $f x \cos\theta$ and a center angle $4\phi$ is illuminated. Also, since the light impinging on a single point upon the mask comes from the entire illumination region of the reflection mirror, having a number of cylindrical surfaces arrayed in parallel, the angular expansion thereof is D/f. Namely, the numerical aperture (NA) of the illumination system is D/(2f). Where the mask side numerical aperture of the projection optical system is Nap1, the coherence factor is:

$$\sigma=D/(2fNAp1)$$

Thus, by changing the diameter of the parallel light impinging on the integrator 11, an optimum coherent factor $\sigma$ can be set.

Here, the parallel light 11' entering the integrator 11 has its sectional intensity already uniformed by the first integrator 201a as described hereinbefore, in the arcuate illumination region, as regards a direction ($\theta$ direction) along the arcuate shape, the uniformness is accomplished by superposition of plural light beams from the integrator 11. As regards a direction (r direction) perpendicular to the arcuate shape, the uniformness is assured by superposition of plural light beams from the integrator 201a. With this arrangement, arcuate illumination with less illuminance irregularities and with good uniform intensity, as compared with conventional structures, can be accomplished upon the surface to be illuminated. Furthermore, since the arcuate illumination region is never provided by cutting it out of a rectangular region as in the conventional structures, the loss of exposure amount is very small and the efficiency is remarkably better.

Referring now to FIGS. 9A and 9B, description will be made on a method of adjusting the coherence factor $\sigma$ of the illumination system by changing the above-described light beam diameter D, in response to interchanging the integrators 201a and 201b.

FIGS. 9A and 9B are schematic views, respectively, of fragmentary sections of a large number of concave mirrors at the reflection surfaces of the integrators 201a and 201b (FIG. 1). As shown in these drawings, the focal point position 201b of the concave mirror 201a and the focal point position of the concave mirror 201b are designed to be approximately coincident with each other. Namely, these mirror are arranged to have substantially the same focal length but the emission angle of light to be emitted therefrom is different. More specifically, the concave surface mirrors 201a and 201b have the same curvature radius, but only the effective diameters of the concave mirrors are different. Namely, the effective diameter 901a of the concave mirror 201a is made larger than the effective diameter 901b of the concave mirror 201b. With this setting, in regard to the EUV light 8' impinging on the first integrator, the divergent or expansion angle 902a of the light beam reflected by the mirror 201a becomes larger, in accordance with the aperture ratio, than the expansion angle 902b of the light beam reflected by the mirror 201b.

Referring back to FIG. 1, the light beam from the point light source array at the focal point position 202 is Fourier transformed by the paraboloid mirror 10a, and at the focal point position 24, what is called Koehler illumination condition is satisfied. Thus, the light beam there has an approximately uniform sectional intensity. However, the light beam diameter at the position 24 is approximately proportional to the expansion angle at the focal point position 202. Namely, as shown in FIGS. 9A and 9B, where the integrator 201a is used, since the expansion angle 202a is larger, the light beam diameter at the position 24 is larger. If on the other hand the integrator 201b is used, since the expansion angle 902b is smaller, the beam diameter at the position 24 is smaller.

Since the light beam at the position 24 is transformed by the paraboloid mirrors 10b and 10c into a light beam 11' of desired size, the light beam diameter 11' impinging on the second integrator 11 can be changed as a result of interchanging the integrators 201a and 201b.

By setting the light beam diameter 11' to a desired size as described above, the coherence factor σ (sigma) of the illumination light impinging on the reflection type mask 16 can be set to a desired magnitude, as has been described in the foregoing. Furthermore, the light beam diameter can be adjusted by using the aperture stop 204. Also, the light beam diameter can be adjusted by changing the magnification of the paraboloid mirrors 10b and 10c.

The exposure method according to this embodiment will be explained more. In FIG. 1, the EUV light 11' incident on the second integrator is collected by the paraboloid mirror 12 in accordance with the principle described above, and it is deflected by the plane mirror 13. Then, after passing through an opening of an NA stop 206 (to be described later) and the masking blade 14, the light produces an arcuate illumination region upon the reflection type mask 16, held by the mask stage 17, whereby arcuate illumination is carried out. Here, the curvature center of the arcuate illumination region is coincident with the optical axis 18AX of the projection optical system. The masking blade 14 serves to block, to some degree and with respect to the reflection type mask, those regions other than the desired region to be exposed.

Figure 14:
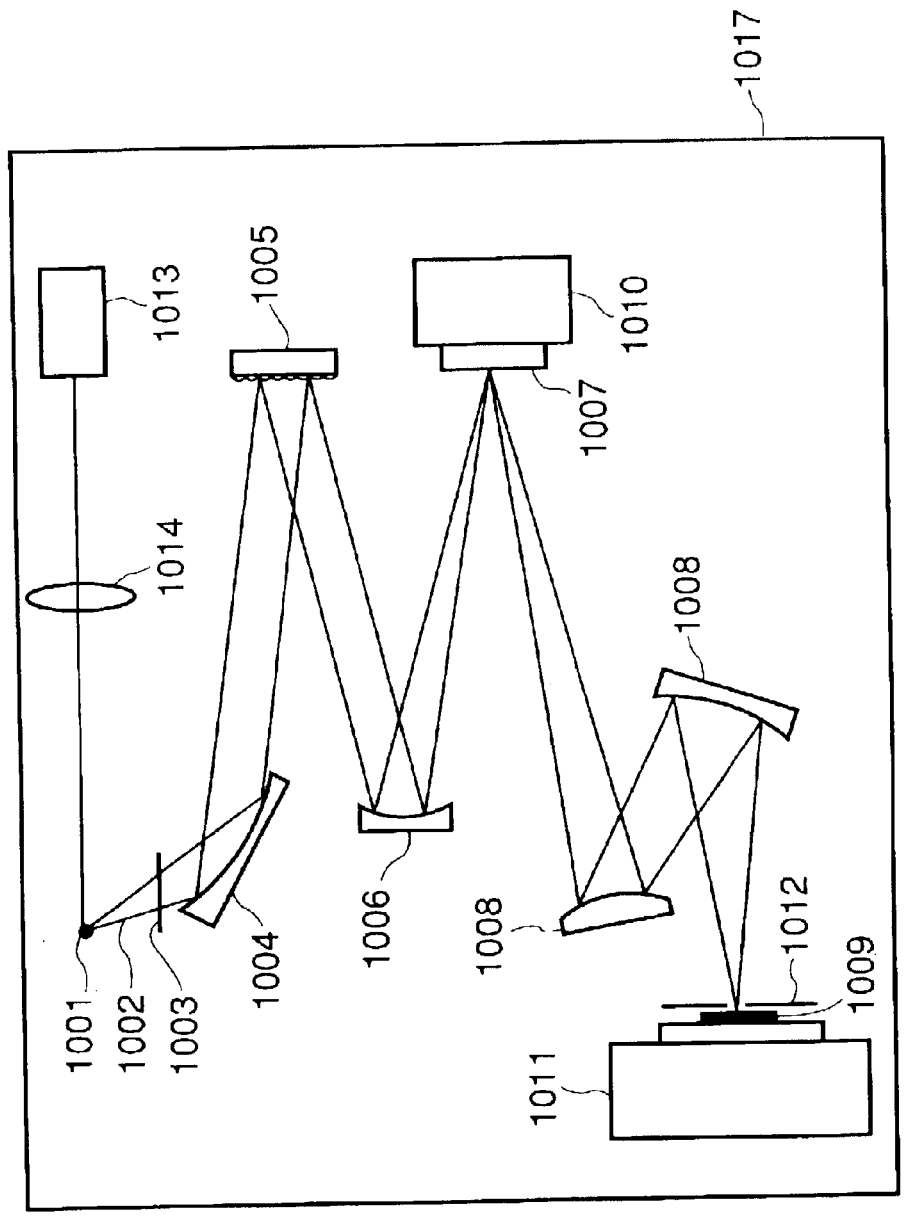
FIG. 14 is a schematic view of a main portion of a conventional example.
Figure 15:
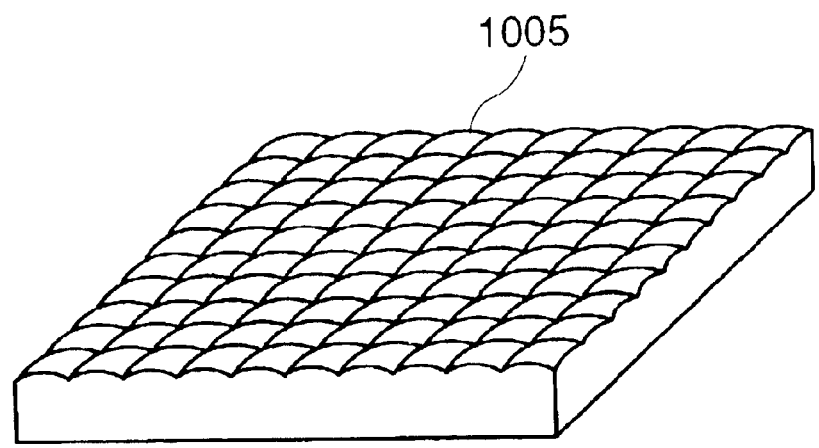
FIG. 15 is a schematic and perspective view of a conventional reflection type integrator.
Figure 16:
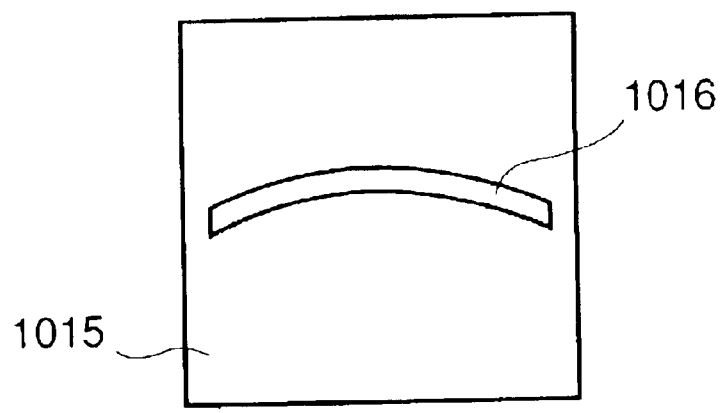
FIG. 16 is a view, illustrating an illumination region and a arcuate region to be used for exposure, in a conventional structure.

Here, it is important that the EUV light beam 12' collected by the paraboloid mirror 12 passes between the mirrors 18a and 18b, constituting the projection optical system. In the conventional structure having been described with reference to FIG. 14, the light beam of the illumination optical system and the light beam of the projection optical system do not intersect with each other in the space. In a case where, like this embodiment, the interval between the mirror 18b of the projection optical system 18 and the reflection type mask 16 is narrow, if the EUV light 12' directed between the mirrors of the projection optical system as in the present embodiment, undesirable interference of the paraboloid mirror 12 or plane mirror 13 with the mask 16 can advantageously be avoided. Although this embodiment is arranged so that the light beam for illuminating the mask passes between first and second mirrors 18a and 18b, in an order from the reflection type mask side, the structure may be modified in accordance with the design of the projection optical system so that a light beam passes between mirrors having a relatively large interval. Substantially the same advantageous effects are attainable also in that occasion. Furthermore, as a matter of course, the structure may be modified so that the light beam passes between a mirror and any optical element other than the mirror of the projection optical system (for example, NA stop 206 of this embodiment or variable slit 19), or between optical elements other than mirrors.

The EUV reflection light from the reflection type mask 16 being illuminated in an arcuate shape, bears information regarding the circuit pattern of the mask. By means of a projection optical system which comprises mirrors 18a–18f, an NA stop 206 and an arcuate variable slit 19, the light is projected and imaged on a wafer (substrate) 20 with a photosensitive material coating, at an optimum magnification best suited for the exposure. The exposure of the circuit pattern is thus completed. The wafer 20 is fixedly mounted on the wafer stage 21, and it is movable along a plane orthogonal to the optical axis of the projection optical system 18 as well as along the optical axis direction. The movement thereof is controlled by use of a measuring device such as a laser interferometer, not shown. If the magnification of the projection optical system is M, the reflection type mask 16 is scanned at a velocity v along a plane orthogonal to the optical axis of the projection optical system 18 and, concurrently therewith, the wafer 20 is synchronously scanned at a velocity v·M along a plane perpendicular to the optical axis of the projection optical system 18. The whole surface exposure is performed in this manner.

Figure 7:
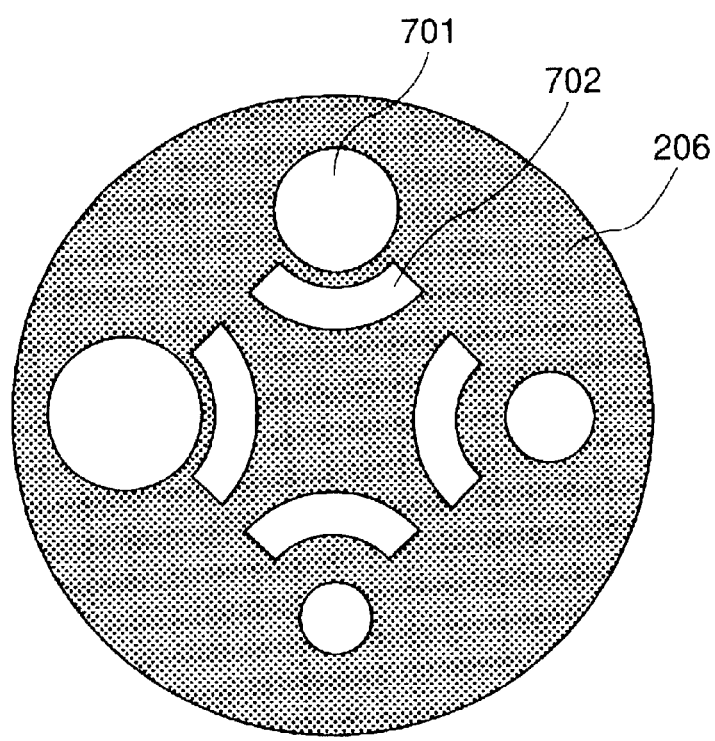
FIG. 7 is a schematic view of an NA aperture.

Next, details of the NA stop 206 will be described with reference to FIG. 7. Denoted in the drawing at 701 is an opening of approximately circular shape, for restricting the NA of the projection optical system. An opening of arcuate shape, being denoted at 702, is defined so as to transmit the illumination light from the illumination system as well as reflection light from the reflection type mask 16. (In accordance with the design of the projection optical system, this opening may be arranged so as to transmit only the reflection light from the mask.) The projection optical system 18 of this embodiment is designed so that a pupil plane is defined in the neighborhood of the reflection surface of the mirror 18b. Thus, by restricting the pupil diameter by use of a stop, a desired numerical aperture NA can be set. In the FIG. 7 example, a plurality of openings having different diameters are formed and disposed concentrically, into a turret structure. The turret is disposed at the position 206 in FIG. 1. By means of a rotation controller, not shown, a desired one of the openings can be placed at the pupil plane position. Alternatively, openings may be disposed along a one-dimensional array and used interchangeably, or a variable aperture stop structure having an opening whose diameter can be changed as desired may be used. Further, although this embodiment uses a stop which has an opening for light from the reflection type mask and an opening for light from the mirror of the projection optical system, wherein the opening for the light from the projection optical system defines the NA, the present invention is not limited to this. For example, the opening may function to define an exposure region.

Figure 8:
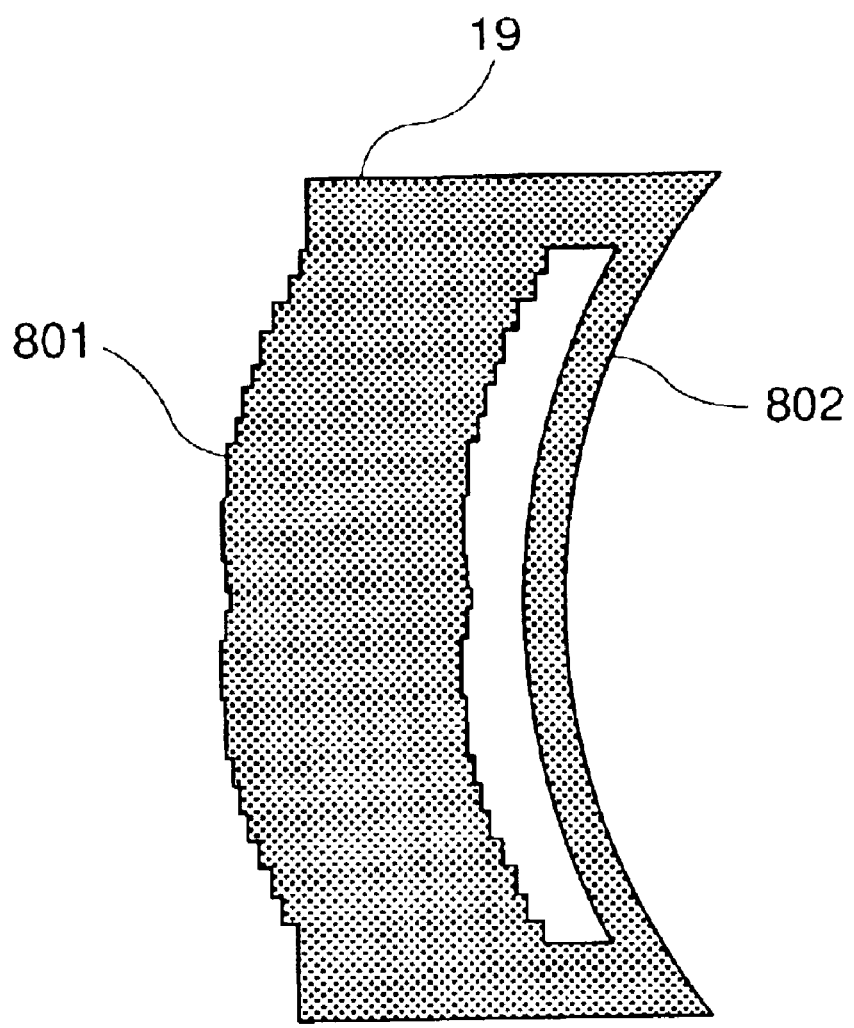
FIG. 8 is a schematic view of a variable arcuate slit.

Referring now to FIG. 8, an arcuate variable slit 19 will be described. Denoted in the drawing at 801 is a movable edge portion for locally changing the width of an arcuate slit. Denoted at 802 is a fixed edge portion which is set along the outside configuration of the mirror 18f of the projection optical system. This arcuate variable slit 19 is disposed at or adjacent an intermediate imaging position of the projection optical system 18 (i.e. the position where an intermediate image of the pattern of the mask 16 is formed), such as shown in FIG. 1. Here, the term "intermediate image" includes not only an image in which the pattern of the mask 16 is exactly imaged but also one in which it is roughly imaged. By placing the slit at this position, rather than at a position adjacent the reflection type mask 16, interference between the arcuate variable slit 19 and the reflection type mask 16 can be avoided. When a circuit pattern of the mask 16 is reduced and transferred to a wafer 20 and if there is non-uniformness of illuminance inside the arcuate slit, it results in non-uniform exposure during the scan exposure. In order to meet this problem, the slit width in such portion of the arcuate slit as having a larger illuminance, may be narrowed in accordance with a signal from a control system, not shown, so that the scan exposure is carried out with a light quantity reduced by desired amount. This procedure enables exposure of the whole exposure region, with uniform intensity. In the example shown in the drawing, the slit width at the central portion is narrowed a little bit, if the illuminance at the central portion of the arcuate slit is slightly higher than the peripheral portion.

Although this embodiment has been described with reference to an example using a movable edge portion 801 and a fixed edge portion 802, the edge 802 may of course be a movable edge.

Figure 10A:
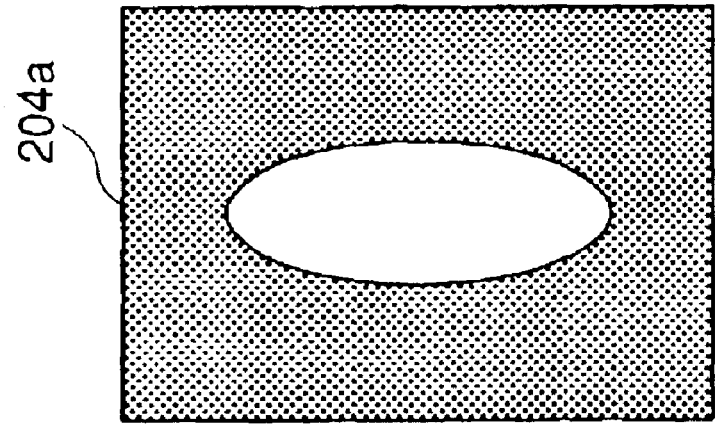
FIGS. 10A, 10B and 10C are schematic views, respectively, for explaining shapes of aperture stops for transformed illumination, respectively.
Figure 10B:
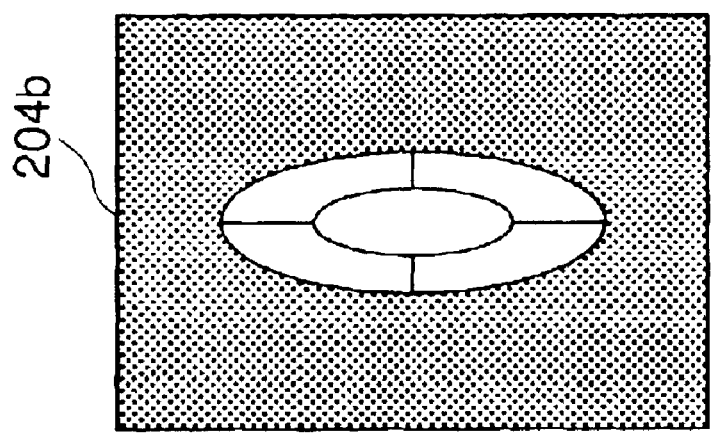
Figure 10C:

Next, referring to FIGS. 10A–10C, description will be made on how to perform modified or transformed illumination such as ring-like illumination, on the basis of switching an aperture stop 204 disposed adjacent the reflection surface of the second integrator. FIGS. 10A–10C illustrate shapes of openings formed in an aperture stop 204. The blank areas correspond to openings through which light can pass. The pattern 204a shows an opening for standard illumination mode. The pattern 204b shows an opening for ring-like illumination mode. The pattern 204c shows an opening for quadruple illumination mode. Some opening patterns such as above are prepared as a turret, for example, shown at 204 in FIG. 1. By rotating the turret in response to a signal from a control system (not shown) and by means of an aperture stop driving system 205, a desired opening shape can be set interchangeably. In place of using a turret, a mechanical method such as sequentially choosing plural aperture stops disposed in an array may be used.

As described above, the aperture stop 204 is disposed adjacent the reflection surface of the second integrator 11. Thus, if the incidence angle of the light impinging on the integrator 11 is $\alpha$, on the reflection surface of the integrator 11 the light beam diameter extends in a direction parallel to the sheet of the drawing (incidence plane) with a magnification $1/\cos\alpha$. In consideration of it, it is necessary that the aperture shape of the aperture stop is similarly extended in the same direction with a magnification $1/\cos\alpha$. In FIG. 10A, the pattern 204a, for example, is used to restrict the incident light beam diameter into a circular shape, the aspect ratio of this ellipse is $1/\cos\alpha$. The same applies to the cases of 204b and 204c.

Next, description will be made on the principle of transformed deformation based on the aperture stop 204, disposed adjacent the reflection surface of the integrator 11, with reference to an example of aperture stop 204b being adapted to ring-like illumination.

Figures 11A, 11B:
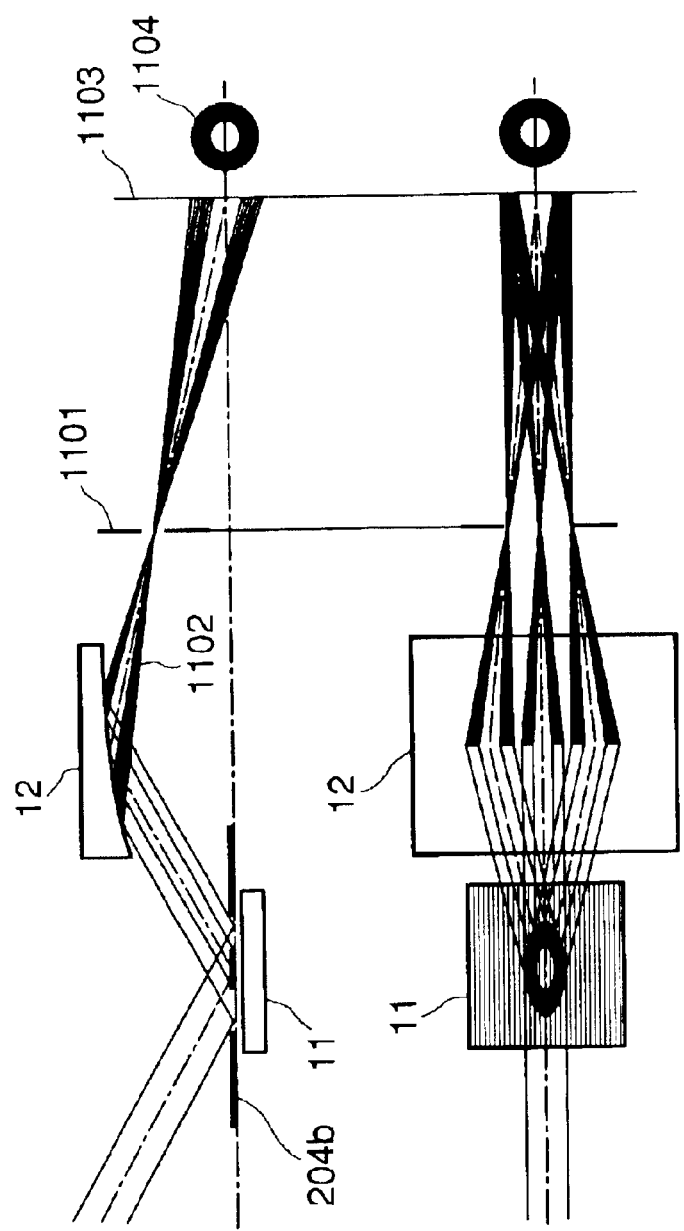
FIGS. 11A and 11B are schematic views, respectively, for explaining ring-like illumination.

FIGS. 11A and 11B illustrate a fragmentary portion of the integrator 11 and paraboloid mirror 12 in FIG. 1, wherein FIG. 11A is a side view and FIG. 11B is a top view. The aperture stop 204b for defining the ring-like illumination mode is disposed such as shown in FIG. 11A. Here, the aperture stop 204b is not illustrated, for explanation purpose.

The light beam incident on the integrator 11 is reflected, while an optical axis central portion and an outside diameter portion thereof are intercepted by the aperture stop 204b. The intensity distribution of this reflection light upon the integrator 11 surface duly corresponds, as a matter of course, to the shape of the opening of the aperture stop 204b. Further, by means of plural cylindrical surfaces, the light beam is reflected with an angular distribution of arcuate shape, as has already been described. The paraboloid surface 12 collects this light beam, to thereby produce a uniform illumination region of arcuate shape at the focal point position 1101 thereof. Here, the position 1101 is approximately equivalent to the position of the reflection type mask 16 in FIG. 1. Since the central portion of the light beam is blocked, the collected light defines a light beam such as shown at 1102 (hatched area). This is also with the case of FIG. 11B. This means that, at the position of intersection between the principal light ray and the optic axis, that is, at the position 1103 being conjugate with the pupil plane, the intensity has a distribution such as shown at 1104. Namely, it means that ring-like illumination is accomplished.

There may be a case where non-uniform illuminance is produced inside the illumination region on the reflection type mask in response to the change of coherence factor or illumination mode described above. In that occasion, illuminance non-uniformness is similarly produced at corresponding sites in the arcuate slit. As described hereinbefore, such non-uniform illuminance can be reduced by controlling the arcuate variable slit 19 and, as a result of it, the exposure non-uniformness on the wafer can be reduced. In this embodiment, the arcuate variable slit 19 is disposed within the projection optical system. If however there is a space inside the illumination system, the arcuate variable slit may be disposed inside the illumination system, to correct illuminance non-uniformness in the illumination region, to be produced in response to the change of coherence factor or illumination mode, similarly.

Next, referring to FIGS. 12 and 13, an embodiment of a device manufacturing method which uses an exposure apparatus described above, will be explained.

Figure 12:
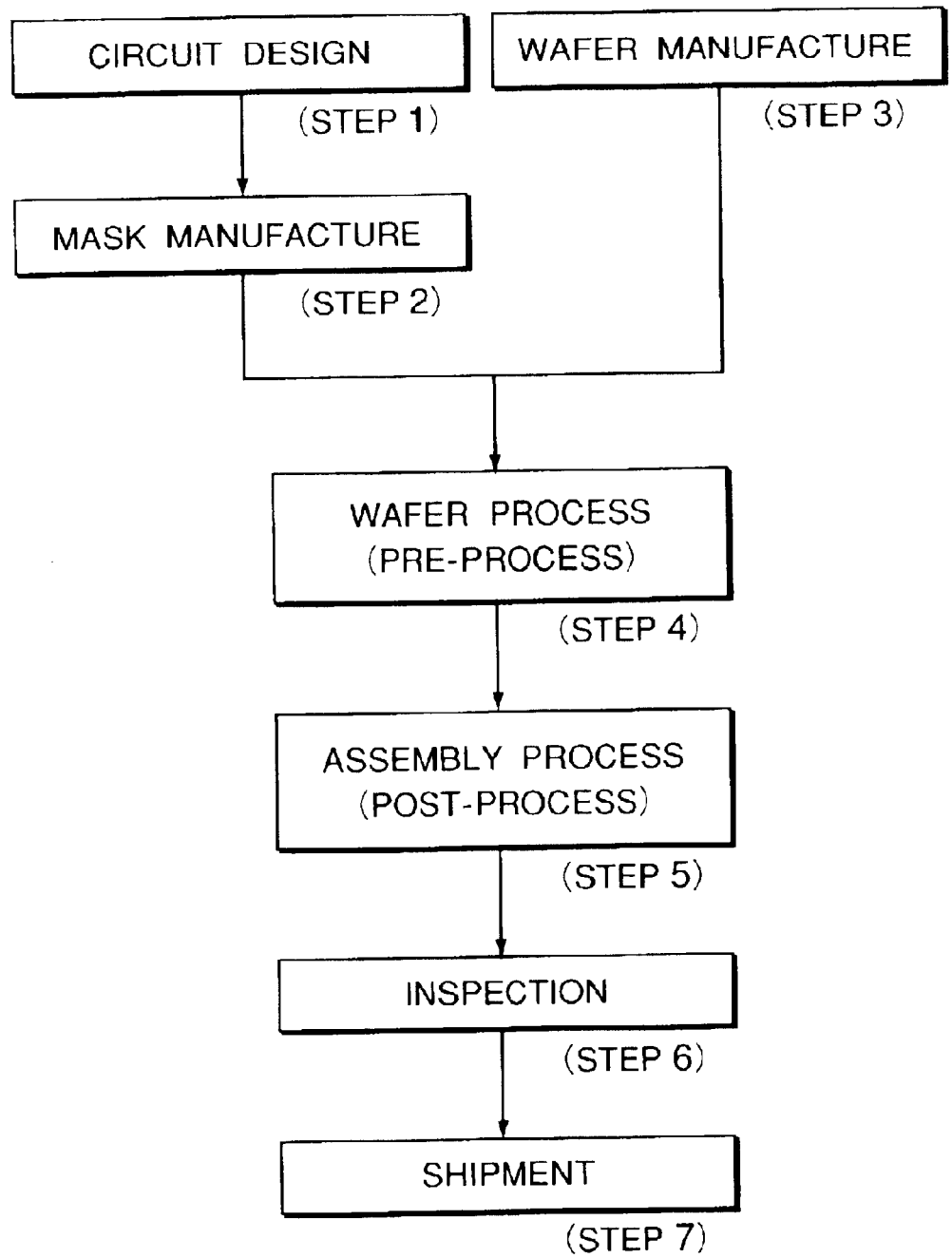
FIG. 12 is a flow chart for explaining device manufacturing processes in an embodiment of the present invention.

FIG. 12 is a flow chart for explaining the procedure of manufacturing various microdevices such as semiconductor chips (e.g., ICs or LSIs), liquid crystal panels, or CCDs, for example. Here, production of semiconductor ships will be described, as an example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 13:
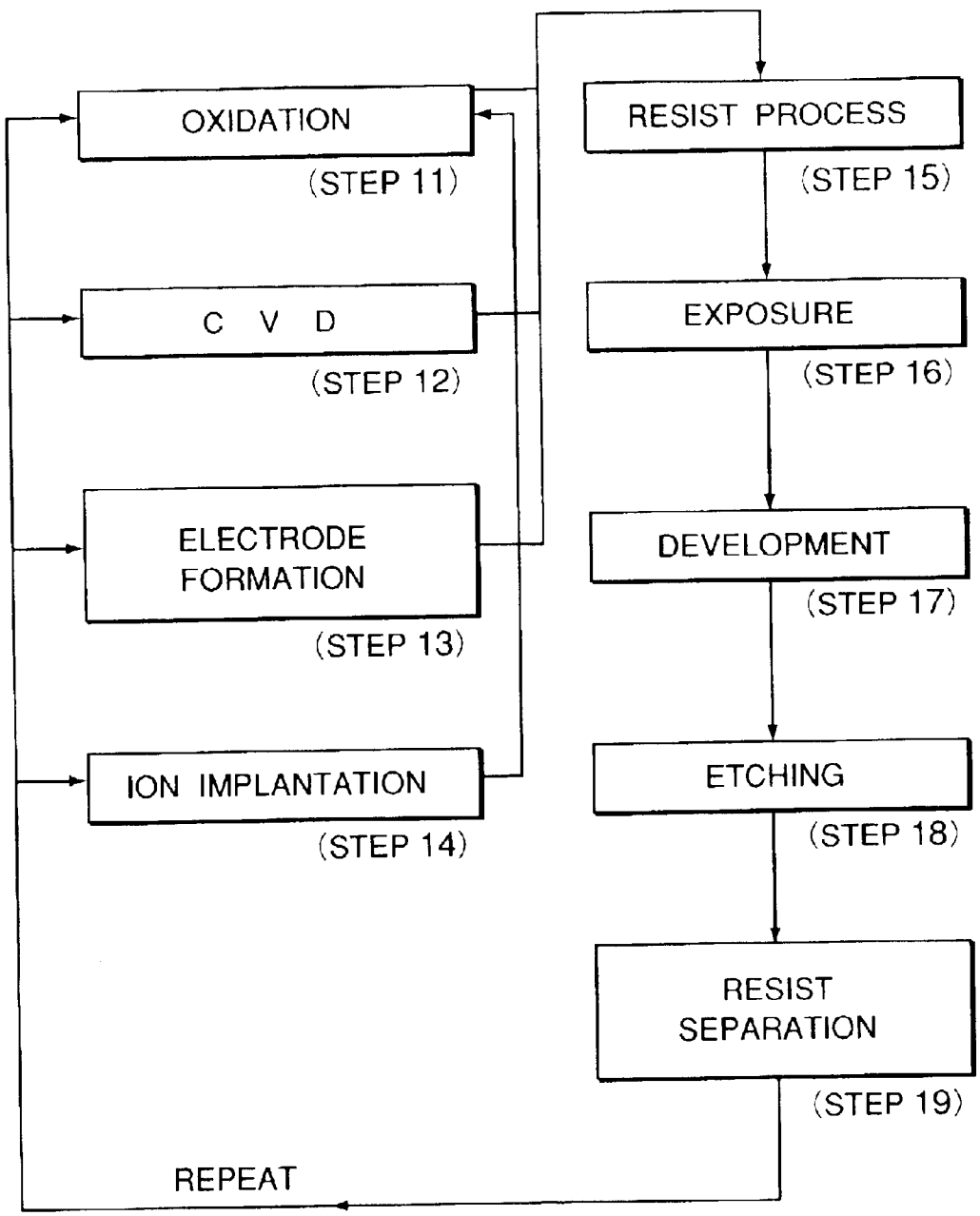
FIG. 13 is a flow chart for explaining details of Step 4 in FIG. 12.

FIG. 13 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

Where an illumination system according to an embodiment of the present invention is used, an arcuate illumination region on the surface to be illuminated can be illuminated with uniform intensity, as compared with conventional structures, yet the light from an EUV light source can be shaped at a high efficiency, with a significantly decreased loss of light quantity.

Further, where the illumination system such as described above is incorporated into an exposure apparatus, it ensures reduction of exposure time and increase of throughput.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for illuminating a reflection type mask with light from a light source and for exposing a substrate with a pattern of the illuminated reflection type mask, said apparatus comprising:

a projection optical system for projecting the pattern of the reflection type mask onto the substrate, said projection optical system having a stop;

wherein said stop has a first opening for defining a numerical aperture of said projection optical system, and a second opening through which light from the reflection type mask passes.

2. An apparatus according to claim 1, wherein light for illuminating the reflection type mask, also, passes through the second opening.

3. An apparatus according to claim 1, wherein the first opening has an approximately circular shape and wherein the second opening has an approximately arcuate shape.

4. An apparatus according to claim 1, wherein the first opening has a variable size.

5. An apparatus according to claim 1, wherein said projection optical system has another stop having a third opening for defining a numerical aperture of said projection optical system, and wherein the third opening has a size different from that of the first opening.

6. An apparatus according to claim 5, wherein the stop having the first opening and the stop having the third opening are disposed on a turret.

7. An apparatus according to claim 1, further comprising (i) a first mirror system for transforming light from the light source into parallel light, (ii) first reflection type integrator means for producing a plurality of first secondary light sources, (iii) second reflection type integrator means for producing a plurality of second secondary light sources by use of light beams from said plurality of first secondary light sources, (iv) a first condensing mirror system for superposing the light beams from said plurality of first secondary light sources one upon another on said second reflection type integrator means, and (v) a second condensing mirror system for superposing light beams from said plurality of second secondary light sources one upon another on the reflection type mask.

8. An apparatus according to claim 1, wherein the light from the light source has a wavelength of not greater than 20 nm.

9. A device manufacturing method, comprising the steps of:

exposing a substrate with a pattern by use of an exposure apparatus as recited in claim 1; and developing the exposed substrate.

* * * * *